United States Patent [19]

Johnson et al.

[11] Patent Number: 5,188,282
[45] Date of Patent: Feb. 23, 1993

[54] VAPOR PHASE FLASH FUSING OF PRINTED WIRING BOARDS

[75] Inventors: Kirk E. Johnson, Diamond Bar; Edward Modzelewski, Chino Hills, both of Calif.

[73] Assignee: Hughes Aircraft Company, Los Angeles, Calif.

[21] Appl. No.: 646,589

[22] Filed: Jan. 28, 1991

[51] Int. Cl.$^5$ .................... B23K 1/015; B23K 31/02
[52] U.S. Cl. .................................... 228/242; 228/248
[58] Field of Search .................... 228/242, 240, 248

[56] References Cited

U.S. PATENT DOCUMENTS

| | | | |
|---|---|---|---|
| 4,022,371 | 5/1977 | Skarvinko et al. | 228/242 |
| 4,392,049 | 7/1983 | Bentley et al. | 228/242 |
| 4,552,300 | 11/1985 | Zovko et al. | 228/242 |
| 4,767,471 | 8/1988 | McLellan | 148/24 |
| 4,838,476 | 6/1989 | Rahn | 228/221 |
| 4,840,305 | 6/1989 | Ankrom et al. | 228/240 |
| 4,871,109 | 10/1989 | Kalota et al. | 228/240 |
| 4,874,124 | 10/1989 | Johns et al. | 228/240 |
| 4,898,991 | 2/1990 | Huang | 228/242 |
| 4,919,729 | 5/1990 | Elmgren et al. | 148/24 |

Primary Examiner—Seidel Richard K.
Assistant Examiner—Jeanne M. Elpel
Attorney, Agent, or Firm—Wanda K. Denson-Low

[57] ABSTRACT

An improved process for the fusing a tin-lead solder mixture deposited to form a finished circuit on a printed circuit or wiring board. The method comprises the rapid or flash fusing of the circuit board having the tin-lead solder mixture deposited thereon by immersing into the vapor of an inert fluid having a boiling point just above the melting point of the solder alloy. Problems with "weak knee" conditions are avoided by adjusting the heating time-at-temperature to that which allows the desired tin-lead solder alloy to form only as a thick "mush" rather than as a molten fluid. By so doing, the solder alloy is formed without the necessary degree of fluidity that causes it to draw away from the edge or rim of plated holes in the board.

19 Claims, 2 Drawing Sheets

VAPOR PHASE FLASH FUSING OF PRINTED WIRING BOARDS

BACKGROUND

The present invention relates generally to methods for making printed circuit boards and more particularly to a method for fusing solder to said boards.

Conventional printed circuit boards typically comprise a copper clad plastic substrate between about 0.020 and 0.060 inches in thickness, into which a plurality of holes are punched or drilled that are used either to mount various components or connecting wires. To produce the circuit, a photoresist is applied to the surface and is developed and holes are made. A coating of copper is then electrolessly plated onto the developed substrate. Then a layer of copper is electroplated onto the layer of electroless copper. A mixture of tin and lead is then plated on top of the copper. The photoresist is then removed and the copper surface is etched to produce the desired circuit pattern. Finally a tin lead solder layer is fused to the etched copper. The board as prepared is then ready for installation of electronic components.

The tin lead solder layer is typically comprised of about 58-70 weight percent tin, with the balance comprising lead, and it is deposited to a thickness of between about 300 and 650 microinches onto the copper surface. When initially deposited, this mixed metal layer basically comprises an mixture of lead and tin globules rather than a true alloy or a solid solution.

While the affinity of these metals is such that a certain amount of alloy formation occurs at room temperature, current practice is to speed up this process by heating the plated board to a temperature above the melting point of solder at which time the tin and lead dissolves therein and a solder alloy is formed. At the present time, the speedup of alloy formation is usually accomplished either by immersing the board in a bath of a hot oil held at a temperature just above the melting point of the solder alloy or by heating the board with an infrared lamp. In both of these methods it has been found that the thermal inertia inherent in these systems tends to retard the quick cooling the molten solder alloy so that a certain amount of fluid flow occurs. This flow usually results in a buildup of solder along the sides of the plated hole and a depletion of the solder around the rims of the holes. A certain level of rim solder is necessary to promote proper solder joint formation. However, if this level is not present, this rim depletion or "weak knee" condition results in a situation where there may not be enough solder to prevent the exposure and subsequent oxidation of at least a part of the underlying intermetallic layer. When this happens a proper fillet cannot form and an unacceptable fillet results.

For example, the hot oil technique typically uses a preheat solder bath at temperature of about 200° F. and a second higher temperature solder at about 400° F. to perform the fusing. However, in practice, it has been found that a temperature gradient often exists across the higher temperature solder bath which is as much as 10°-15° F. This differential heating across the bath results in differential heating of the boards which causes poor fusing. Furthermore, heating of the boards to a temperature of about 400° F. results in excessively liquifying the solder so that the solder tends to pull away from the rim of the holes in the boards. This results in the aforementioned "weak knee" condition. It also exposes the underlying intermetallic layer to oxidation. This oxidation causes poor solder joints when components are soldered to the board. An article entitled "The Fusing of Tin-Lead Plating on High Quality Circuit Boards", by B. D. Dunn, published in Transaction of the Institute of Metal Finishing, Vol. 58. pp. 26-28 (1980) discusses the hot oil technique. In the infrared heating method, the variation in temperature across the board is not controllable at all, and this also results in very poor fusing of the tin-lead mixture.

Accordingly, it is an objective of the present invention to provide for a method of fusing tin-lead coated printed circuit boards that prevents the formation of weak knee conditions at the edges of holes in the boards.

SUMMARY OF THE INVENTION

The process of the present invention provides an improved method of fusing a tin and lead solder alloy deposited on a circuit on a copper plated polymeric or glass fiber reinforced polymeric wiring or circuit board having a plurality of holes formed therein. The method comprises the steps of (a) depositing a tin-lead mixture on a formed copper surface of a circuit board to coat the copper with the tin-lead mixture; (b) rapidly heating the tin-lead mixture coated board in the vapor of a heated inert fluid having a boiling point just above the melting point of the mixture for a time sufficient for the mixture to fuse and form a solder alloy, but which is insufficient for the alloy to form a flowable fluid; and (c) rapidly cooling the board to solidify the solder alloy. By so doing the alloy is formed without the extra degree of fluidity and surface tension necessary to cause it to draw away from the edge or rim of the holes therein, thus substantially eliminating potential problems of "weak knee" conditions. A vapor phase heater is employed that uses a vapor phase material that comprises an inert fluid having a boiling point just above the fusion point of the tin-lead alloy and that boils at a temperature of about 190° C. (374° F.) for the solder mixture range disclosed herein.

BRIEF DESCRIPTION OF THE DRAWINGS

The various features and advantages of the present invention may be more readily understood with reference to the following detailed description taken in conjuction with the accompanying drawings, wherein like reference numerals designate like structural elements, and in which.

DETAILED DESCRIPTION

Figure 1:
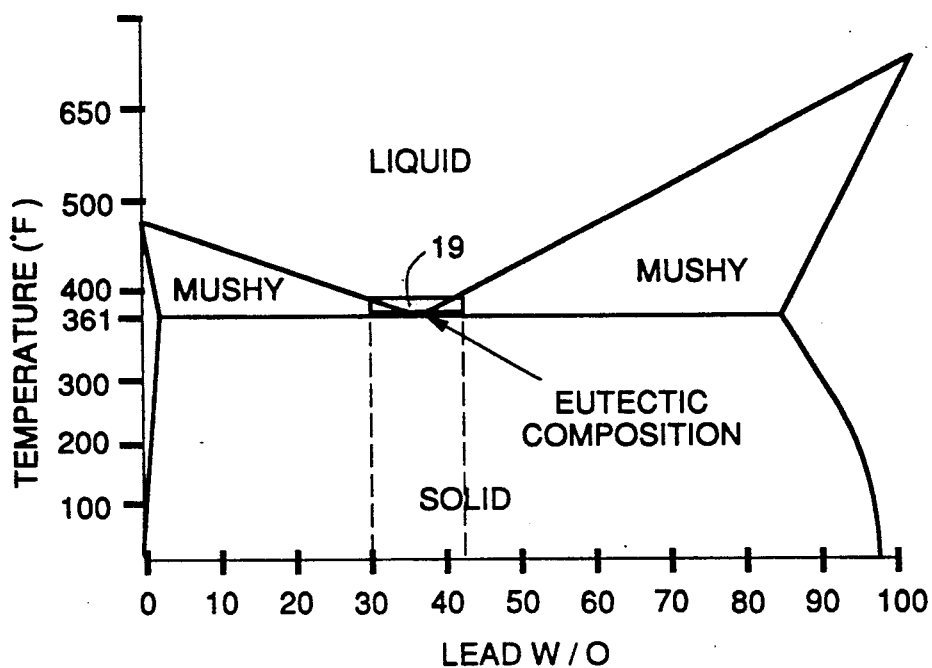
FIG. 1 is a graph illustrating a phase diagram for tin-lead mixtures, showing the melting point of the tin-lead alloy system as function of changing lead content.

With reference to the drawings, FIG. 1 is a graph illustrating a phase diagram for tin-lead mixtures, showing the melting point of the tin-lead alloy system as function of changing lead content and having a temperature of 361 degrees F. at the eutectic composition. The process of the present invention employs a deposited tin-lead mixture having an alloy composition comprising between about 58% and about 70% tin, with the balance comprising lead. This is also typical of the tin-lead mixtures employed in conventional fusing processes. The tin-lead phase diagram also illustrates the solid and liquid phase and the "pasty" or "mushy" phases of the mixture based upon alloy composition and temperature.

Figure 2:
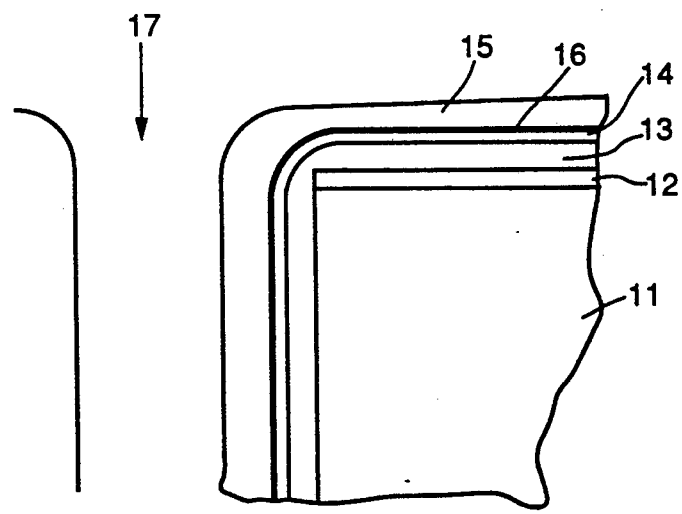
FIG. 2 shows a cross section of an as plated printed circuit board.

FIG. 2 shows a cross section of an as plated printed circuit board 10 including a portion of a through hole 17. As is illustrated in FIG. 2, a printed wiring board 10 comprises a polymer-glass laminate substrate 11, for example, onto which is bonded a first copper cladding layer 12. The substrate 11, is typically made from laminated epoxy-or phenolic-glass compositions, having a thickness of between about 0.020 to about 0.060 inches. Next, an electroless copper layer 13 is deposited onto the copper cladding layer 12 with an electro copper layer 14 then being deposited onto the electroless copper layer 13. The electroless and electro deposited copper layers 13 and 14 are deposited in a manner which defines the internal circuit on the board 10. Finally, a tin-lead mixture 15 is plated onto the plated electro copper layer 14, with some of the tin diffusing into the electro copper layer 14 to form a copper-tin intermetallic layer 16. The tin-lead mixture 15 is typically deposited to a thickness between about 300 and about 650 micro-inches. The electroless copper, electro deposited copper and tin-lead mixture layers 13, 14 and 15 deposit onto the substrate 11 including the inside surface and rim or knee of a through hole 17. In the as plated condition, the board 10 has a sufficient amount of the tin-lead mixture 15 to permit soldering electronic components to the board 10. The process steps described above used in fabricating the printed circuit board 10 shown in FIG. 2 are conventional and are well known to those skilled in the printed circuit board fabrication art.

The tin-lead mixture 15 is deposited by standard electrochemical techniques. As particularly shown in FIG. 2, this deposited tin-lead composition, while uniform in appearance and thickness, is not an alloy in the normal sense of the term. Rather it is an intimate mixture of small lead globules more or less uniformly dispersed within the tin matrix. To achieve the low melting alloy solder composition necessary for successfully protecting the board from oxidation and subsequently soldering inserted elements thereto, this mixture must be fused in such a manner that the two metals will mutually dissolve in one another to produce the desired solder alloy without flowing away in any substantial amount from the rim areas.

Printed circuit boards 10 fused in accordance with the process of the present invention have a minimum of defective conditions resulting from an alloy loss or weak knee conditions around the knee 18 of holes 17 in these boards 10. A vapor phase heater is employed that uses an inert fluid having a boiling point of about 374° F., which is just above the fusion point of the eutectic tin-lead alloy 15. Shaded area 19 of FIG. 1 illustrates a suitable flash heat temperature range of 370 to 380 degrees F. for an alloy composition of 30-42% lead. In a preferred embodiment of the present invention, the board 10 is "flash fused" by controllably immersing the board 10 into the vapor of a heated inert fluid having a boiling point just above the fusion temperature for the tin-lead alloy involved for a short period of time, followed by a rapid cooling or quenching of the board 10. When the heating is done for between about 1 and about 20 seconds, and preferably for between about 5 and about 15 seconds, it has been found that this time-at-temperature results in the formation of a viscous alloy "mush" rather than a true low viscosity molten fluid on the surfaces. It has also been found that this mushy condition is adequate to complete the final breakup of the tin-lead mixture 15 and complete the reaction of the tin and lead elements to form a true alloy. However, this mushy condition is insufficiently fluid to permit the surface tension to cause the alloy deposited along the sides of the hole 17 to sag and flow away from the rim areas 18 in any substantial amount before the board 10 rapidly cools to below the freezing point of the formed alloy. Thus, more solder remains at the edge of the hole 17 to produce better solderability of inserted components, with far fewer rejections caused by "weak-knee" conditions.

Any inert fluid having the "right" boiling point may be used in the present process. Preferred is a perfluorinated polyether, such as Galden LS 215, available from the Montedison Chemical Co. It has been found that a number of these commercially available perfluorinated polyethers have a combination of inertness and boiling point, so that one can easily control the heat input at a desired level without significant difficulty.

The process disclosed for fusing plated tin-lead alloy 15 on a printed circuit board 10 eliminates the use of hot oil along with its related concerns for air quality and waste disposal. It also eliminates the need for cleaning the board 10 after fusion, thus reducing the number of operations and their related costs without detriment to the product. The process also lowers repair and rejection rates by increasing the retention of solder on the rim of the hole 17, thus better preserving board solderability through long periods of storage. The process also eliminates the conventional preheating step found in hot oil fusing techniques.

Figure 3:
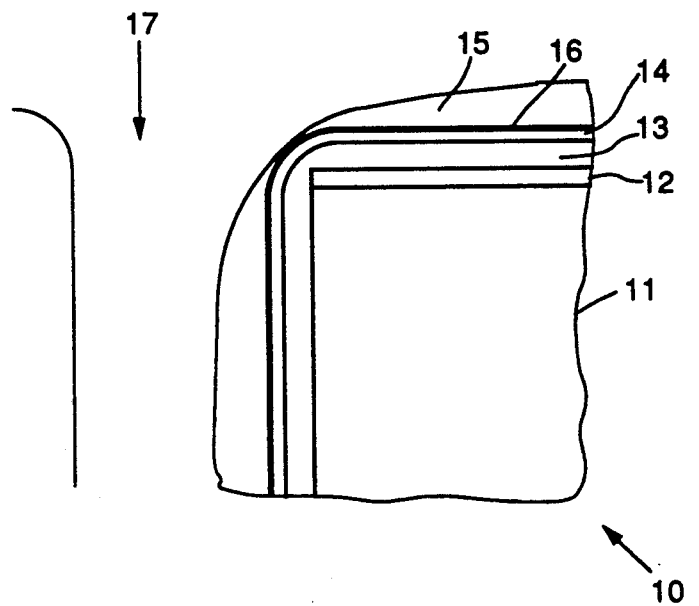
FIG. 3 shows a cross section of a circuit board fused using a hot oil melting process of the prior art showing a "weak knee" condition.
Figure 4:
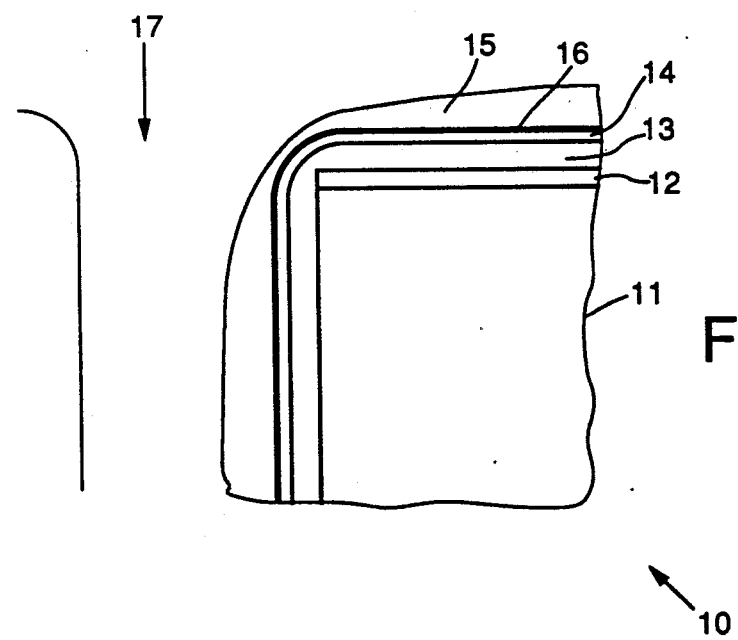
FIG. 4 shows a cross section of a circuit board fused using the method of the present invention.

FIG. 3 shows a cross section of a circuit board 10 fused using a hot oil melting process of the prior art. As shown therein, the thickness of the solder at the hole rim is substantially thinner than that of the surrounding areas on the board and hole interior surfaces. In contrast, FIG. 4 shows a cross section of a circuit board 10 fused using the method of the present invention, wherein the amount of solder retained in the knee areas is much greater than that produced by the prior art method.

In the following examples, which are illustrative of, and not intended to limit the invention, the parts and percentages are by weight and the temperatures are in degrees Fahrenheit, unless otherwise stated.

EXAMPLE

A total of nine 0.020 and eight 0.060 inch thick tin-lead deposited printed circuit boards 10 were flash fused according to the parameters of the present invention on an HTC batch vapor phase fuser. No flux was used in this operation and, other than a wipe with a paper towel to remove a small quantity of unreduced oxide on the surface, no other cleaning operation was needed. The results obtained are summarized in Table 1. These data show that the average retained knee solder thickness for the 0.020 inch thick boards was 181 microinches and for the 0.060 inch boards the average retained thickness was 194 microinches.

TABLE 1

| Sample No. | Solder Composition (SN%/PB%) | Solder Thickness Micro Inches Original | Solder Thickness Micro Inches Retained | Fuse Time Seconds | Board Thickness Inches |
|---|---|---|---|---|---|
| 1 | 65/35 | 340 | 84 | 20 | 0.060 |
| 2 | 62/38 | 333 | 217 | 15 | 0.060 |
| 3 | 68/32 | 258 | 229 | 15 | 0.060 |
| 4 | 63/37 | 294 | 162 | 15 | 0.060 |
| 5 | 58/42 | 421 | 138 | 15 | 0.020 |
| 6 | 59/41 | 512 | 133 | 15 | 0.020 |
| 7 | 61/39 | 398 | 241 | 10 | 0.020 |
| 8 | 65/35 | 373 | 204 | 15 | 0.020 |
| 9 | 64/36 | 228 | 203 | 7 | 0.020 |
| 10 | 60/40 | 368 | 133 | 8 | 0.020 |
| 11 | 64/36 | 349 | 219 | 8 | 0.020 |
| 12 | 63/37 | 347 | 177 | 9 | 0.020 |
| 13 | 61/39 | 353 | 236 | 10 | 0.060 |
| 14 | 57/43 | 392 | 196 | 11 | 0.060 |
| 15 | 63/37 | 409 | 190 | 12 | 0.060 |
| 16 | 63/37 | 385 | 237 | 13 | 0.060 |

COMPARATIVE EXAMPLE 1

A total of twenty plated boards 10 (10 each 0.020 and 0.060 thickness) were fused in a Radiant Model F 3000 infrared fuser. An RMA flux was applied to the surfaces just prior to the board entering the hot zone by roller applicators which are an integral part of the fuser system. Variables adjusted included solder plate thickness, conveyer speed, preheat temperature, and the voltage applied to the infrared element. Each of the boards was manually cleaned and dried. The results obtained are summarized in Table 2. These data show that the average thickness of retained knee solder was 49.7 microinches on the 0.020 inch boards and 53.6 microinches on the 0.060 inch thick boards.

TABLE 2

| Sample No. | Board Thickness Inches | Knee Solder Thickness Micro Inches | Preheat (°F.) | Fuse Variables RMS Voltage Top | Fuse Variables RMS Voltage Bottom | Conveyer Speed Ft/Min | Fused Knee Solder Thickness Micro Inches |
|---|---|---|---|---|---|---|---|
| 1 | 0.020 | 124 | 360 | 290 | 300 | 14.0 | 48 |
| 2 | | 381 | 360 | 290 | 300 | 14.0 | 45 |
| 5 | | 777 | 200 | 300 | 300 | 12.0 | 47 |
| 6 | | 705 | 200 | 200 | 200 | 5.0 | 51 |
| 11-1 | | 475 | 375 | 400 | 400 | 26.2 | 53 |
| 12-1 | | 439 | 375 | 400 | 400 | 26.2 | 72 |
| 13-1 | | 558 | 375 | 350 | 350 | 20.0 | 49 |
| 14-1 | | 524 | 375 | 350 | 350 | 20.0 | 55 |
| 20-1 | | 840 | 350 | 290 | 300 | 14.0 | 45 |
| 24 | | 267 | 200 | 250 | 250 | 7.0 | 42 |
| 7-1 | 0.060 | 385 | 400 | 385 | 400 | 12.0 | 55 |
| 9-1 | | 375 | 375 | 450 | 450 | 12.0 | 52 |
| 16 | | 103 | 200 | 300 | 300 | 5.0 | 44 |
| 29 | | 330 | 200 | 300 | 300 | 6.0 | 64 |
| 31 | | 264 | 200 | 300 | 300 | 6.0 | 64 |
| 46 | | 397 | 200 | 350 | 350 | 8.0 | 37 |
| 66 | | 486 | 200 | 300 | 300 | 5.0 | 58 |
| 69 | | 528 | 200 | 400 | 400 | 11.0 | 49 |
| 87 | | 746 | 200 | 400 | 400 | 9.0 | 49 |
| 462 | | 378 | 200 | 350 | 350 | 8.0 | 63 |

COMPARATIVE EXAMPLE 2

A total of 24 plated boards 10 (12 each 0.020 and 0.060 thickness) were fused in a Proheco 24"×24"×8" Model SP hot oil fuser. Each of the boards was manually dipped into J&S 821 flux for 15 seconds and then placed horizontally in a preheating bath for a period of 30 seconds and at a temperature of 210° F., after which time they were immediately transferred to the hot oil fuser, also in a horizontal position. After the fusing time-at-temperature was reached, the boards were removed, again in the horizontal position, to allow the solder to solidify. The boards were scrubbed and air dried to remove any oil residues present. The results obtained for these boards are summarized in Table 3. These data show that the average level of retained knee solder for the 0.020 inch thick boards was 39.7 microinches and for the 0.060 inch thick boards the average value was 54.9 microinches.

TABLE 3

| Sample No. | Board Thickness Inches | Knee Solder Thickness Micro Inches | Fuse Variables Time (Sec) | Fuse Variables Temp (°F.) | Fused Knee Solder Thickness Micro Inches |
|---|---|---|---|---|---|
| H-1 | 0.020 | 330 | 10 | 380 | 48 |
| I-1 | | 600 | 10 | 380 | 44 |
| J-1 | | 870 | 10 | 380 | 42 |
| K-1 | | 310 | 30 | 380 | 42 |
| L-1 | | 820 | 30 | 380 | 44 |
| M-1 | | 330 | 50 | 380 | 38 |
| N-1 | | 580 | 50 | 380 | 40 |
| O-1 | | 840 | 50 | 380 | 32 |
| P-1 | | 240 | 10 | 410 | 32 |
| Q-1 | | 720 | 10 | 410 | 32 |
| R-1 | | 290 | 50 | 410 | 42 |
| S-1 | | 920 | 50 | 410 | 40 |
| H-2 | 0.060 | 290 | 20 | 380 | 40 |
| I-2 | | 530 | 20 | 380 | 95 |
| J-2 | | 820 | 20 | 380 | 56 |
| K-2 | | 330 | 40 | 380 | 50 |
| L-2 | | 530 | 40 | 380 | 53 |
| M-2 | | 260 | 60 | 380 | 50 |
| N-2 | | 600 | 60 | 380 | 56 |
| O-2 | | 790 | 60 | 380 | 50 |
| P-2 | | 210 | 20 | 410 | 42 |
| Q-2 | | 790 | 20 | 410 | 62 |
| R-2 | | 380 | 60 | 410 | 56 |
| S-2 | | 970 | 60 | 410 | 48 |

The data obtained from the two comparative tests clearly show that the average amount of retained knee solder was less than half of that shown by boards produced according to the process of the present invention. Further, the absence of a need for a scrubbing/cleaning step in the present invention lowers the cost and improves the reliability of these boards even more.

Thus, there has been described a new and improved method for producing improve quality solder layers on printed circuit boards. It is to be understood that the above-described embodiment is merely illustrative of some of the many specific embodiments which represent applications of the principles of the present invention. Clearly, numerous and other arrangements can be readily devised by those skilled in the art without departing from the scope of the invention.

What is claimed is:

1. In a method for producing a solder alloy coated printed circuit board, said board comprising a copper plated substrate having a plurality of holes formed therein and onto which a tin-lead mixture is deposited and then fused, the improvement being a method for maintaining sufficient solder alloy at the rim of said holes in the printed circuit board comprising the steps of:

flash fusing the board in the vapor of a heated fluid having a boiling point just above the fusion point of the tin-lead mixture for a time sufficient for the mixture to form a solder alloy but which is insufficient for the alloy to form a flowable fluid; and rapidly cooling the board to solidify the solder alloy.

2. The method of claim 1 wherein the deposited mixture comprises between 58 and 70 weight percent tin, with the balance comprising lead.

3. The method of claim 1 wherein the thickness of said deposited mixture is between 300 and 650 microinches.

4. The method of claim 1 wherein the temperature of said heated inert fluid is between 370° F. and 380° F.

5. The method of claim 1 wherein the time at temperature is between 1 and 20 seconds.

6. The method of claim 5 wherein the heat time at temperature is between 5 and 15 seconds.

7. A method of fusing a tin and lead solder alloy deposited on a copper plated circuit board having a plurality of holes formed therein, the method maintaining sufficient solder alloy at the rim of holes in the printed circuit board, the method comprising the steps of:
  depositing a tin-lead mixture on a formed copper surface of a circuit board to coat the copper with the tin-lead mixture;
  flash fusing the board in the vapor of a heated fluid having a boiling point just above the fusion point of the tin-lead mixture for a time sufficient for the mixture to form a solder alloy but which is insufficient for the alloy to form a flowable fluid; and
  rapidly cooling the board to solidify the solder alloy.

8. The method of claim 7 wherein the deposited mixture comprises between 58 and 70 weight percent tin, with the balance comprising lead.

9. The method of claim 7 wherein the thickness of said deposited mixture is between 300 and 650 microinches.

10. The method of claim 7 wherein the temperature of said heated inert fluid is between 370° F. and 380° F.

11. The method of claim 7 wherein the time at temperature is between 1 and 20 seconds.

12. The method of claim 11 wherein the heat time at temperature is between 5 and 15 seconds.

13. In a method for fusing a layer of solder mixture deposited on a copper layer, said copper layer being deposited on a substrate of the type having a plurality of holes formed therein, said copper layer and said layer of solder mixture being deposited on the surface of said substrate including the surface of said holes, the improvement comprising a method for fusing the solder mixture to provide a solder alloy while maintaining sufficient solder alloy at the edges of said holes which comprises:
  flash fusing the layer of solder mixture in the vapor of a heated inert fluid having a boiling point just above the fusion point of the layer of solder mixture for a time sufficient for the mixture to form a solder alloy but which is insufficient for the solder alloy to form a flowable liquid; and
  rapidly cooling the solder alloy to solidify the solder alloy.

14. The method of claim 13 wherein the layer of solder mixture comprises a tin-lead mixture.

15. The method of claim 14 wherein the layer of solder mixture comprises between 58 and 70 weight percent tin, with the balance comprising lead.

16. The method of claim 13 wherein the thickness of the layer of solder mixture is between 300 and 650 microinches.

17. The method of claim 13 wherein the flash heat temperature is between 370 degrees F. and 380 degrees F.

18. The method of claim 13 wherein the time at temperature is between 1 second and 20 seconds.

19. The method of claim 13 wherein the time at temperature is between 5 seconds and 15 seconds.

* * * * *